United States Patent [19]

Tanaka et al.

[11] Patent Number: 5,291,037
[45] Date of Patent: Mar. 1, 1994

[54] LIGHT-EMITTING DEVICE

[75] Inventors: Yukio Tanaka, Yokohama; Ryoichi Tohmon, Tokyo, both of Japan

[73] Assignee: Eastman Kodak Company, Rochester, N.Y.

[21] Appl. No.: 923,764

[22] Filed: Aug. 3, 1992

[30] Foreign Application Priority Data

Mar. 4, 1992 [JP] Japan .................. 4-047201
Apr. 6, 1992 [JP] Japan .................. 4-083856

[51] Int. Cl.⁵ .......................................... H01L 33/00
[52] U.S. Cl. .................................... 257/79; 257/13; 257/87; 257/93; 257/94; 372/44
[58] Field of Search .......... 372/45, 46, 44; 257/12, 257/13, 87, 93, 94, 79

[56] References Cited

U.S. PATENT DOCUMENTS 3,998,672 12/1976 Miyoshi et al. ................. 257/79

FOREIGN PATENT DOCUMENTS 0014692 2/1979 Japan .......................... 257/94
0117692 9/1979 Japan .......................... 257/94

Primary Examiner—Georgia Y. Epps
Attorney, Agent, or Firm—Raymond L. Owens

[57] ABSTRACT

A light-emitting device in which the increase in the intensity of the emitted light is linear with respect to the increase in current, thereby facilitating current-based control of the light intensity. In the device, this is achieved by providing a high-resistance region, or a furrow, between the electrode on the semiconductor surface and the portion of the device p-n junction that is exposed on the surface.

2 Claims, 6 Drawing Sheets

LIGHT-EMITTING DEVICE

BACKGROUND OF THE INVENTION

1. Field of the Invention

The present invention relates to a light-emitting device, and more particularly to a surface emitting type light-emitting device that has a p-n junction.

2. Description of the Prior Art

Light-emitting devices are used in optical printers that use a beam of light to record information, in barcode image reading systems that utilize the intensity of a reflected beam of light, and in optical communications devices that utilize optical signals.

FIGS. 7 and 8 show the structure of a conventional light-emitting device. With reference to the drawings, GaAsP containing tellurium is used to form an n-type GaAsP semiconductor layer 2 into which zinc is diffused to form a p-type GaAsP semiconductor layer 1. A positive electrode (p-electrode) 3 is then formed on the upper surface of the p-type GaAsP semiconductor layer 1 and a negative electrode (n-electrode) 4 on the lower surface of the n-type GaAsP semiconductor layer 2. When a forwardly biased voltage is applied to the junction between the p-type GaAsP semiconductor layer 1 and the n-type GaAsP semiconductor layer 2, the electrical energy is converted into optical energy by the recombination of the minority carriers injected into the p-type GaAsP semiconductor layer 1 and n-type GaAsP semiconductor layer 2 with the majority carriers, producing an emission of light.

However, when a forwardly biased voltage is applied to a p-n junction, the relationship between the current flowing in the light-emitting device and the optical output is as shown by the solid line in the graph of FIG. 9. That is, in low current regions the increase in optical output power relative to the increase in current is not linear but is instead strongly dependent on the degree of current increase. In FIG. 9 the broken line is a straight line that indicates a constant, or linear, relationship between the increase in current and the increase in optical output power.

That is, when a voltage V is applied to the p-n junction, the device current is divided into a component that is proportional to $\exp(eV/kT)$ (hereinafter referred to as the type A current component) and a component that is proportional to $\exp(eV/2kT)$ (hereinafter referred to as the type B current component), and the intensity of light emitted by the light-emitting device is proportional to the type A current component. In a high current region the type A current component accounts for the major portion of the total current, so the increase in the optical output power of the light-emitting device is linear with respect to the increase in the current. However, when the current is small the type B current component accounts for a large proportion, and the increase in light intensity relative to the increase in current becomes nonlinear.

In a light-emitting device, an increase in light intensity that is nonlinear with respect to the increase in current presents problems when it comes to using the current to control the light intensity, making it difficult to control the light intensity when such light-emitting devices are used as light sources of optical printers, image readers and optical communications devices.

SUMMARY OF THE INVENTION

An object of the present invention is therefore to provide a light-emitting device in which at low current levels the light intensity increases linearly with respect to increasing current.

In accordance with the present invention, this object is attained by a light-emitting device including a p-n junction formed between a p-type semiconductor layer, and an n-type semiconductor layer, and an electrode on the level in which light emission is produced by applying a forwardly-biased voltage across such electrode the improvement comprising in a high-resistance region provided between the electrode arranged on the device surface and the portion of a p-n junction that is exposed on such surface.

The object is also attained by a light-emitting device comprising a p-n junction formed between a p-type semiconductor layer and an n-type semiconductor layer in which light emission is produced by applying a forwardly-biased voltage across electrodes, wherein a furrow is provided between an electrode arranged on the semiconductor layer surface and the portion of a p-n junction that is exposed on the surface.

In the light-emitting device according to the present invention, by providing a high-resistance region between an electrode arranged on the semiconductor layer surface and the portion of a p-n junction that is exposed on the surface, applying a forwardly-biased voltage suppresses the flow of current in the vicinity of the p-n junction exposed on the surface, thereby suppressing the recombination of electrons and holes at the depletion layer in the vicinity of the p-n junction that is exposed on the surface. This results in the suppression of current components not related to light emission, producing a linear relationship between the increase in device current and the increase in the amount of light emitted.

Also, in accordance with a further embodiment of the invention, by providing a furrow between the electrode arranged on the semiconductor layer surface and the portion of a p-n junction that is exposed on the surface, applying a forwardly-biased voltage suppresses the flow of current in the vicinity of the p-n junction exposed on the surface, thereby suppressing the recombination of electrons and holes at the depletion layer in the vicinity of the p-n junction that is exposed on the surface, also thereby suppressing current components not related to light emission and producing a linear relationship between the increase in device current and the increase in the amount of light that is emitted.

Further features of the invention, its nature and various advantages will become more apparent from the accompanying drawings and following detailed description of the invention.

Figure 4:
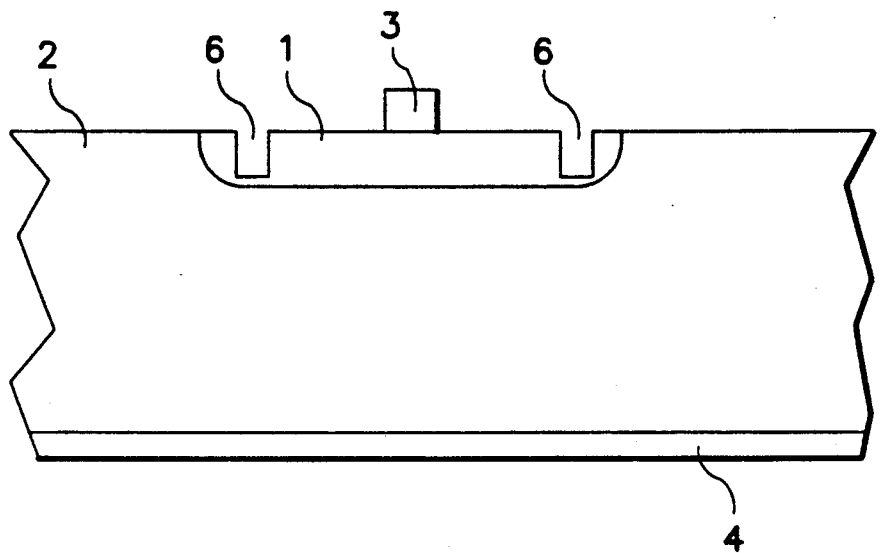
Figure 5:
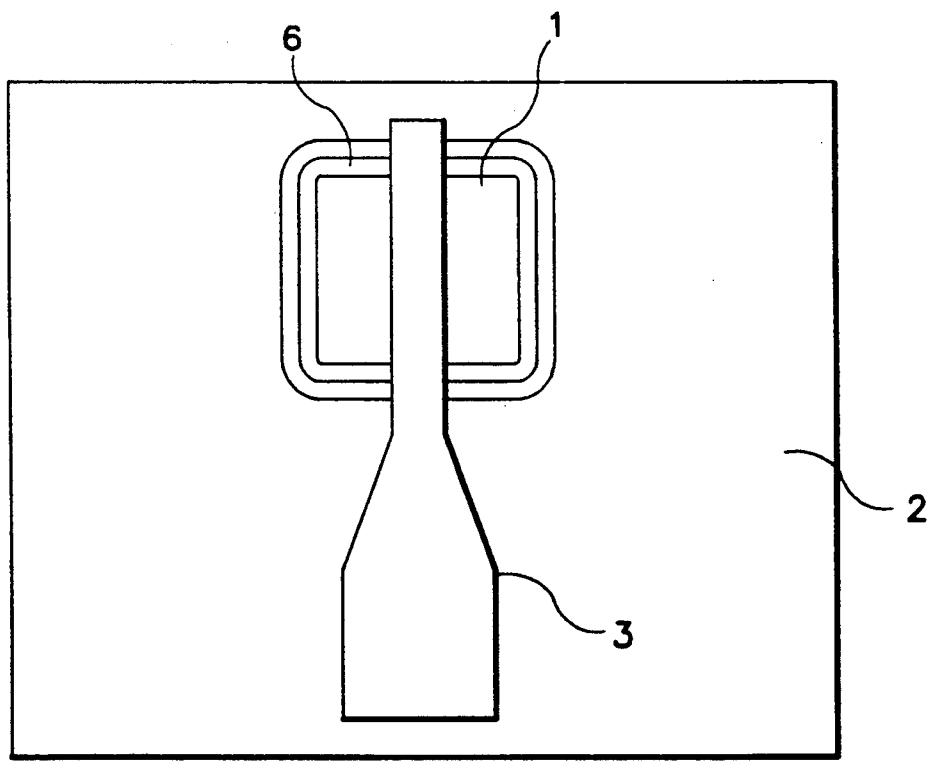
Figure 6:
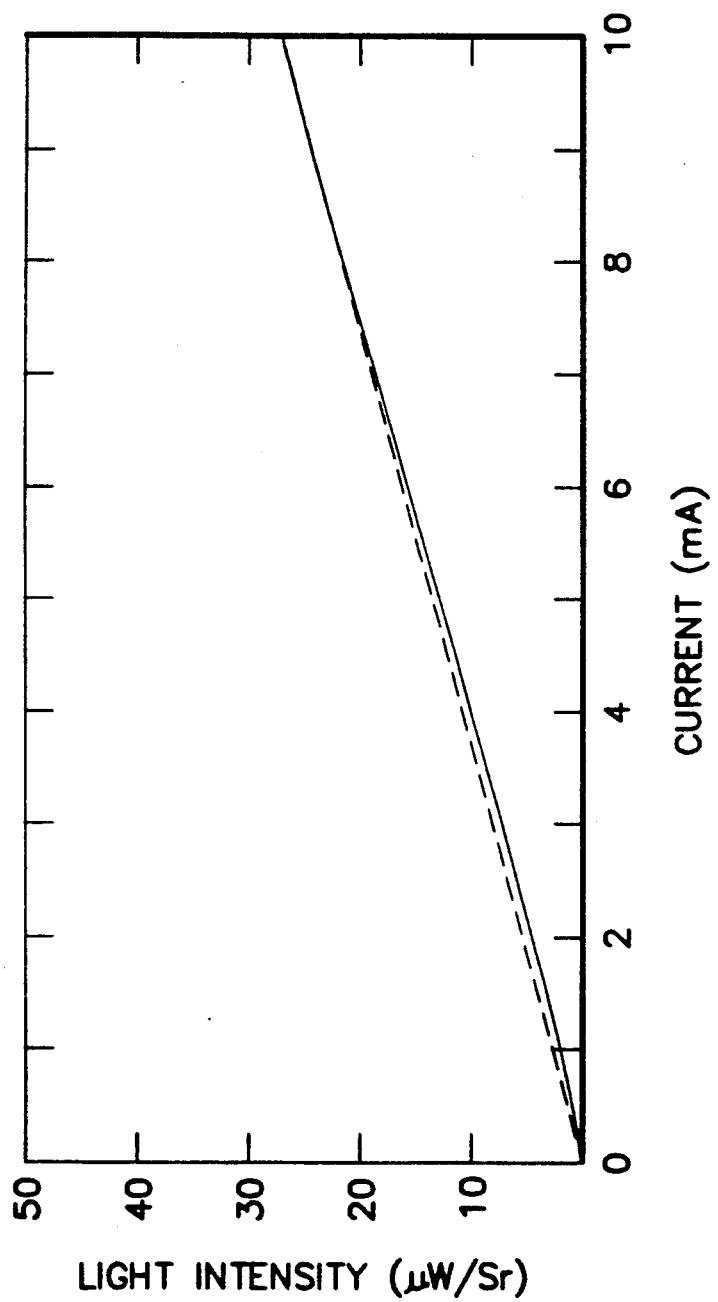
Figure 7:
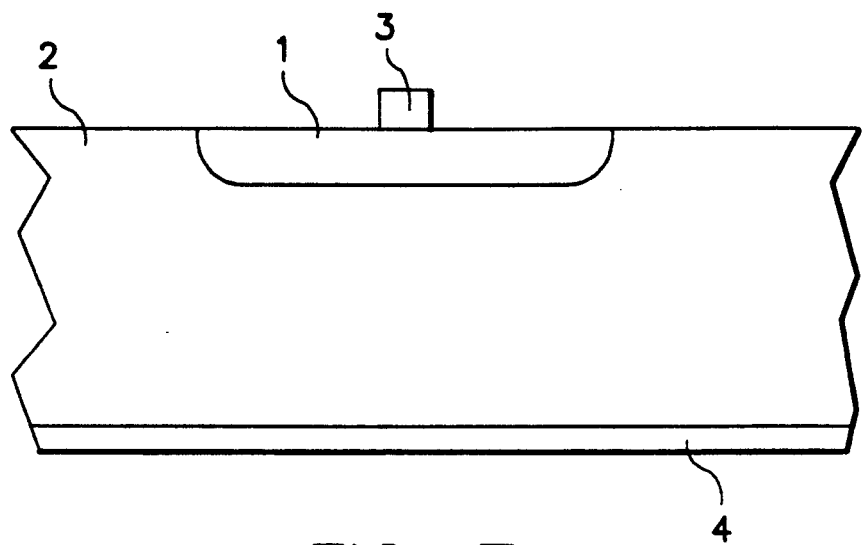
Figure 8:
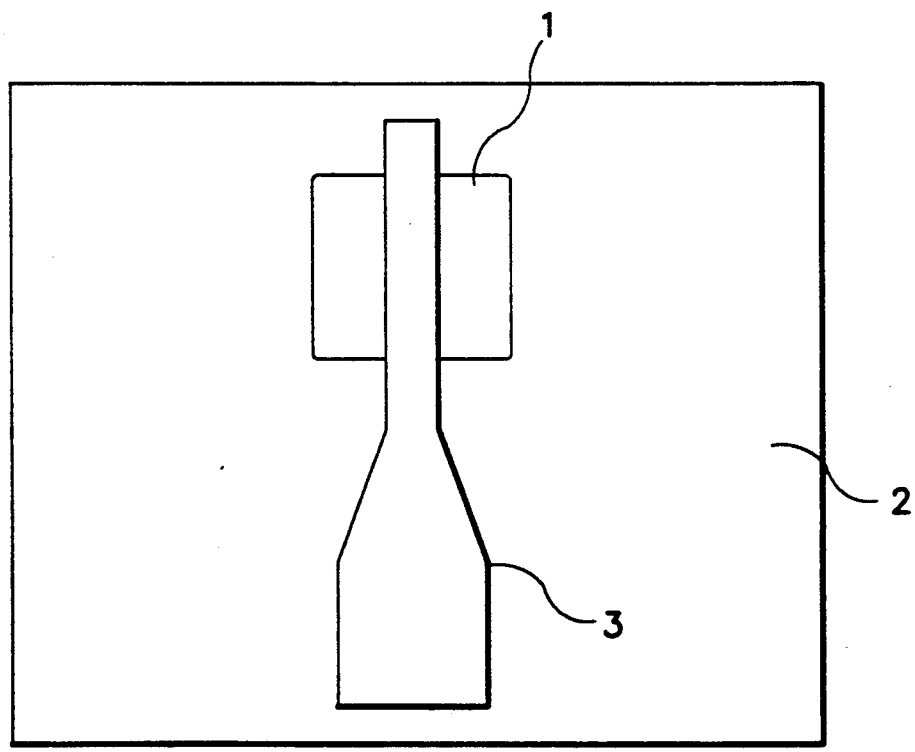

FI. 3 is a graph showing the relationship between current and light intensity in the light-emitting device according to the first embodiment;

FIG. 4 is a cross-sectional view of a light-emitting device according to a second embodiment of the present invention;

FIG. 5 is a plan view of the light-emitting device according to the second embodiment;

FIG. 6 is a graph showing the relationship between current and light intensity in the light-emitting device according to the second embodiment;

FIG. 7 is a cross-sectional view of a conventional light-emitting device;

FIG. 8 is a plan view of a conventional light-emitting device; and

Figure 9:
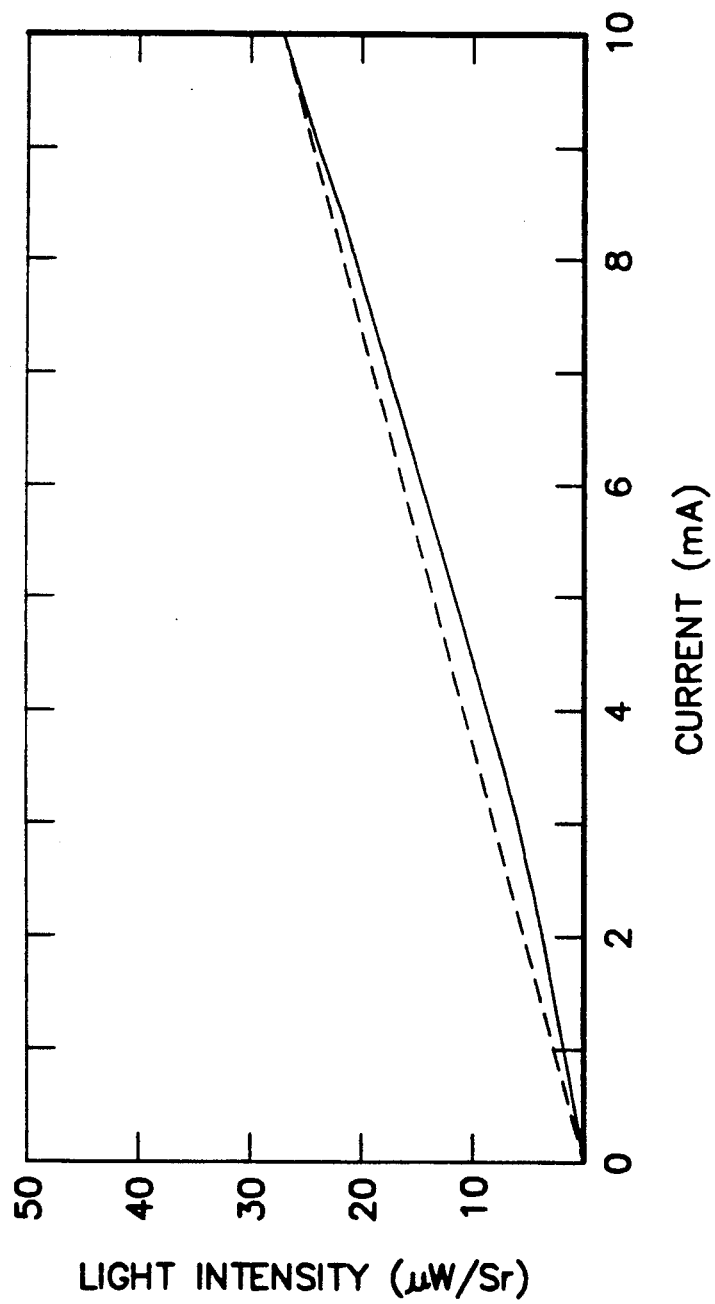

FIG. 9 is a graph showing the relationship between current and light intensity in a conventional light-emitting device.

DESCRIPTION OF THE PREFERRED EMBODIMENT

Figure 1:
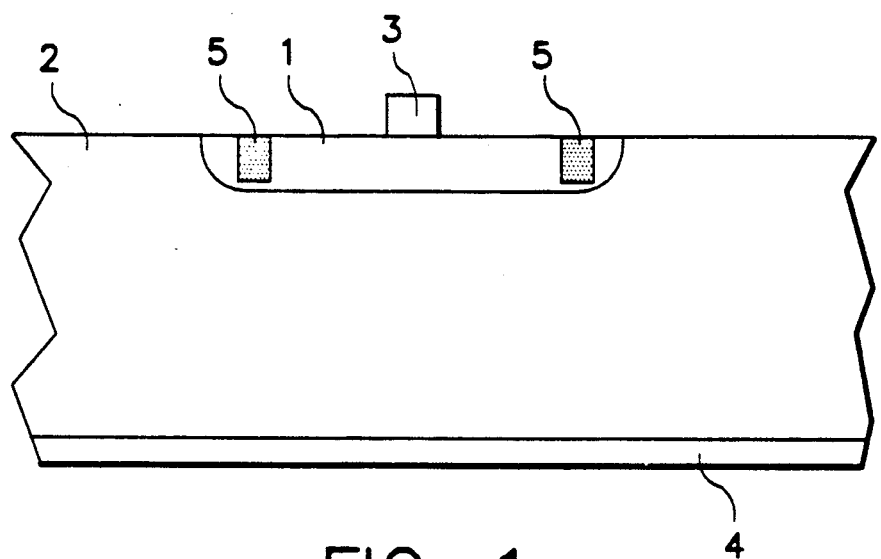
FIG. 1 is a cross-sectional view of a light-emitting device according to a first embodiment of the present invention.
Figure 2:
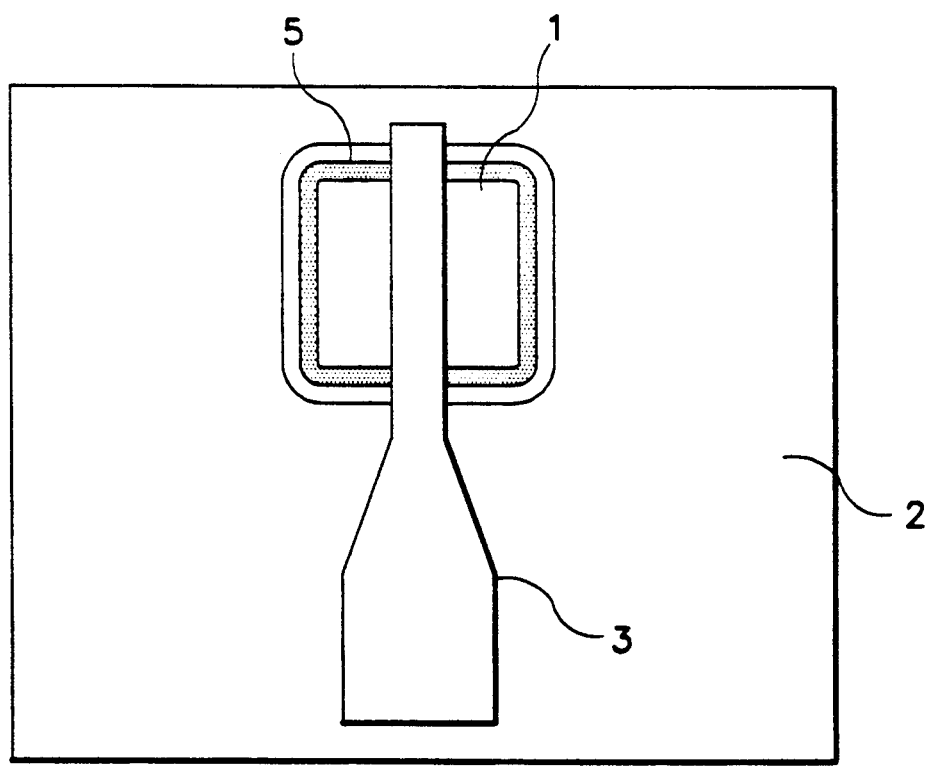
FIG. 2 is a plan view of the light-emitting device according to the first embodiment.

FIGS. 1 and 2 show the structure of a light-emitting device according to a first embodiment of this invention. With reference to the drawings, an n-type GaAsP semiconductor layer 2 is formed of GaAsP containing tellurium, and zinc is diffused into this n-type GaAsP semiconductor layer 2 to form a p-type GaAsP semiconductor layer 1. A positive electrode (p-electrode) 3 is then formed on the upper surface of the p-type GaAsP semiconductor layer 1 and a negative electrode (n-electrode) 4 on the lower surface of the n-type GaAsP semiconductor layer 2, as shown in FIG. 1.

This invention is characterized by the formation of a high-resistance region 5 in the vicinity of the interface between the p-type GaAsP semiconductor layer 1 and n-type GaAsP semiconductor layer 2 thus formed. Formation of the high-resistance region 5 is effected by proton irradiation of the interface portion of the p-n junction p-type GaAsP semiconductor layer 1.

The operation of the light-emitting device thus configured will now be described. As has been briefly explained, when a forwardly-biased voltage V is applied to the p-n junction formed by the p-type GaAsP semiconductor layer 1 and n-type GaAsP semiconductor layer 2, the device current is divided into a component that is proportional to exp (eV/kT) (type A current component) and a component that is proportional to exp(eV/2kT) (type B current component), and the intensity of light emitted by the light-emitting device is proportional to the type A current component.

When the current is large, that is, when the voltage V is large, the type A current component accounts for the major portion of the total current. As the amount of light emitted by the light-emitting device is proportional to the type A current component, the light amount will therefore increase linearly with respect to the increase in the device current and will have little dependence on the current.

However, under small current conditions, meaning when voltage V is small, it is the type B current component that accounts for a relatively large proportion of the current and the ratio between the type A and B current components therefore depends on the voltage, so the increase in light intensity resulting from an increase in the current becomes nonlinear. Here, the type B current component current consists mainly of electron and hole recombinations which occur in the depletion region in the vicinity of the p-n junction exposed on the device surface.

Figure 3:
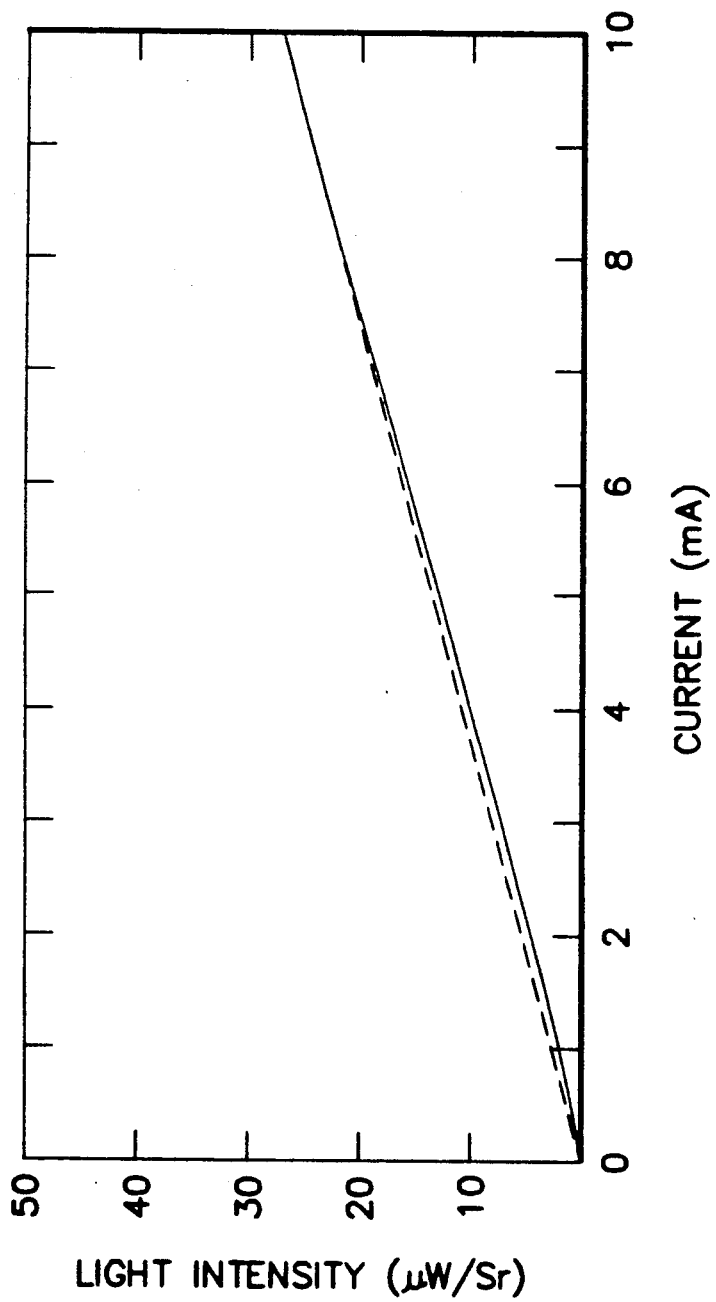

In the light-emitting device of this invention, the high-resistance region 5 provided in the p-type GaAsP semiconductor layer 1 in the vicinity of the interface of the p-type GaAsP semiconductor layer 1 and n-type GaAsP semiconductor layer 2 impedes current flow in the portion of the p-n junction that is exposed on the surface, and thereby enables the recombination of electrons and holes to be suppressed and the type B current component to be reduced. As a result, as shown by FIG. 3, even in low current regions a linear relationship between the increase in device current and the increase in light intensity can be achieved.

While the above description describes the use of proton irradiation to form the high-resistance region, this is not limitative, with other techniques being applicable, such as neutral particle implantation.

FIGS. 4 and 5 illustrate a second embodiment of the present invention. In the second embodiment, which has substantially the same structure as the first embodiment, a furrow 6 is formed in the p-type GaAsP semiconductor layer 1 in the vicinity of the interface of the p-type GaAsP semiconductor layer 1 with the n-type GaAsP semiconductor layer 2.

The furrow 6 may be formed by using a photoresist or an oxide or nitride layer to produce a mask pattern on the device surface, then using dry or wet etching to form the furrow 6, and then removing the mask material.

The furrow 6 provided in the vicinity of the interface of the p-type GaAsP semiconductor layer 1 and n-type GaAsP semiconductor layer 2 impedes current flow in the portion of the p-n junction that is exposed on the surface, and thereby enables the recombination of electrons and holes to be suppressed and the type B current component to be reduced. As a result, as shown by FIG. 6, even in low current regions a linear relationship between the increase in device current and the increase in light intensity can be achieved.

While in the above description the n-type semiconductor layer is GaAsP that contains tellurium, GaAsP containing other elements such as tin, selenium, sulfur, germanium, and silicon may also be used. Similarly, while in the above description the p-type semiconductor layer is GaAsP that contains zinc, GaAsP containing other elements such as magnesium, manganese, cadmium and the like may also be used.

Furthermore, while a p-type semiconductor layer has been described as being formed by means of impurity diffusion in the n-type semiconductor layer, this can be reversed, with an n-type semiconductor layer being formed in the p-type semiconductor layer. Also, while in the above description GaAsP is used as the p- and n-type semiconductor material, other compound semiconductors may be used such as GaAs, AlGaAsP, GaP, and InGaP, for example.

The invention has been described in detail with particular reference to certain preferred embodiments thereof, but it will be understood that variations and modifications can be effected within the spirit and scope of the invention.

What is claimed is:

1. In a light-emitting device including a p-n junction in which light emission is produced by applying a forwardly-biased voltage to the junction via a first electrode formed on a first surface of the device and a second electrode formed on a second surface of the device, and in which a portion of the p-n junction is exposed on the first surface of the device, the improvement comprising:

a high-resistance region provided between the first electrode arranged on the first surface of the device and the portion of the p-n junction that is exposed on the first surface.

2. The light-emitting device according to claim 1 wherein the high-resistance region is a furrow formed in the p-type layer.

* * * * *